(12) United States Patent
Hsiao et al.

(10) Patent No.: US 10,796,964 B2
(45) Date of Patent: *Oct. 6, 2020

(54) TRANSISTOR STRUCTURE

(71) Applicant: United Microelectronics Corp., Hsinchu (TW)

(72) Inventors: Shih-Yin Hsiao, Chiayi County (TW); Ching-Chung Yang, Hsinchu (TW); Kuan-Liang Liu, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/428,651

(22) Filed: May 31, 2019

(65) Prior Publication Data
US 2019/0287860 A1    Sep. 19, 2019

Related U.S. Application Data

(63) Continuation of application No. 15/813,945, filed on Nov. 15, 2017, now Pat. No. 10,373,872.

(30) Foreign Application Priority Data

Oct. 13, 2017 (TW) .............................. 106135221 A

(51) Int. Cl.
*H01L 29/06* (2006.01)
*H01L 27/02* (2006.01)
(Continued)

(52) U.S. Cl.
CPC .. *H01L 21/823425* (2013.01); *H01L 21/8249* (2013.01); *H01L 21/823437* (2013.01);
(Continued)

(58) Field of Classification Search
CPC ..... H01L 21/823425; H01L 21/823437; H01L 21/8249; H01L 27/0251; H01L 29/42368;
(Continued)

(56) References Cited

U.S. PATENT DOCUMENTS 5,583,364 A    12/1996  Nakamura
7,061,029 B1 *  6/2006  Lee ..................... H01L 29/0692
                                                          257/213

(Continued)

FOREIGN PATENT DOCUMENTS

TW          437004        5/2001
TW       201714306        4/2017

OTHER PUBLICATIONS

"Office Action of Taiwan Counterpart Application," dated Jul. 15, 2019, p. 1-p. 5.

*Primary Examiner* — Galina G Yushina
(74) *Attorney, Agent, or Firm* — J.C. Patents

(57) ABSTRACT

A transistor structure includes a source region and a drain region disposed in a substrate, extending along a first direction. A polysilicon layer is disposed over the substrate, extending along a second direction perpendicular to the first direction, wherein the polysilicon layer includes a first edge region, a channel region and a second edge region formed as a gate region between the source region and the drain region in a plane view. The polysilicon layer has at least a first opening pattern at the first edge region having a first portion overlapping with the gate region; and at least a second opening pattern at the second edge region having a second portion overlapping with the gate region.

7 Claims, 7 Drawing Sheets

(51) Int. Cl.
*H01L 21/8249* (2006.01)
*H01L 21/8234* (2006.01)
*H01L 29/49* (2006.01)
*H01L 29/78* (2006.01)
*H01L 29/423* (2006.01)

(52) U.S. Cl.
CPC ...... *H01L 27/0251* (2013.01); *H01L 29/0607* (2013.01); *H01L 29/4238* (2013.01); *H01L 29/42368* (2013.01); *H01L 29/4925* (2013.01); *H01L 29/7832* (2013.01); *H01L 29/7835* (2013.01); *H01L 29/78* (2013.01)

(58) Field of Classification Search
CPC .............. H01L 29/4238; H01L 29/0607; H01L 29/4925; H01L 29/7832; H01L 29/7835; H01L 28/78
See application file for complete search history.

(56) References Cited

U.S. PATENT DOCUMENTS

| | | | |
|---|---|---|---|
| 7,244,975 | B2 | 7/2007 | Chen et al. |
| 10,373,872 | B2* | 8/2019 | Hsiao ............... H01L 21/823425 |
| 2004/0152244 | A1* | 8/2004 | Yamamoto ........ H01L 21/76213 |
| | | | 438/142 |
| 2006/0214223 | A1* | 9/2006 | Sasaki ................ H01L 29/0847 |
| | | | 257/336 |
| 2007/0042539 | A1 | 2/2007 | Jeong et al. |
| 2010/0195375 | A1* | 8/2010 | Park ..................... G11C 11/412 |
| | | | 365/156 |
| 2011/0073962 | A1* | 3/2011 | Chu .................... H01L 29/0653 |
| | | | 257/408 |
| 2012/0319238 | A1* | 12/2012 | Chuang ............ H01L 21/82343 |
| | | | 257/532 |
| 2017/0110536 | A1* | 4/2017 | Hsiao ................. G06F 17/5072 |
| 2017/0294505 | A1* | 10/2017 | Shin ...................... H01L 21/762 |

* cited by examiner

TRANSISTOR STRUCTURE

CROSS REFERENCE TO RELATED APPLICATION

This application is a continuation application of and claims the priority benefit of U.S. application Ser. No. 15/813,945, filed on Nov. 15, 2017, now allowed, which claims the priority benefit of Taiwan patent application serial no. 106135221, filed on Oct. 13, 2017. The entirety of each of the above-mentioned patent applications is hereby incorporated by reference herein and made a part of the specification.

BACKGROUND OF THE INVENTION

Field of the Invention

The invention relates to a semiconductor manufacturing technology and more particularly to a transistor structure.

Description of Related Art

In the integrated circuit of a semiconductor, the field effect transistor is a major component. A field effect transistor is basically the structure of the metal-oxide-semiconductor (MOS), including a gate structure and a source region and a drain region located at two sides of the gate structure and on the substrate. Besides, a gate insulation layer is disposed between the substrate and the gate structure. Generally, a thickness of gate insulation layer determines a threshold voltage when the transistor starts operating. Since the gate insulation layer is formed by performing a thermal oxidation process to the substrate, the thickness of the gate insulation layer on the edge region thereof is thinner, and the threshold voltage of the transistor is influenced.

Besides, if the thickness of the gate insulation layer is excessively thin and the operational voltage is excessively high, for example, is within an operating range of medium voltage (MV) or high voltage (HV), a leakage may occur.

The above problems occur more significantly when the transistor has a smaller size. Therefore, in the design and manufacturing processes, factors affecting the quality of transistors needs to be eliminated to as few as possible.

SUMMARY OF THE INVENTION

The invention relates to a transistor structure, wherein an opening is disposed at an edge region for at least eliminating the occurrence of kink effect or that of gate-induced drain leakage (GIDL) caused by a gate.

According to an embodiment, the invention provides a transistor structure including a source region and a drain region, and the source region and the drain region are disposed in a substrate and extend along a first direction. A polysilicon layer is disposed over the substrate and extends along a second direction perpendicular to the first direction. The polysilicon layer includes a first edge region, a channel region and a second edge region. The first edge region, the channel region and the second edge region are formed as a gate region located between the source region and the drain region. The polysilicon layer includes at least a first opening pattern at the first edge region and at least a second opening pattern at the second edge region, the first opening pattern has a first portion overlapping the gate region, and the second opening pattern has a second portion overlapping the gate region in a plane view.

In an embodiment, the transistor structure further includes a gate insulation layer disposed on the substrate and between the source region and the drain region, wherein the polysilicon layer is located on the gate insulation layer.

In the transistor structure according to an embodiment, the gate insulation layer has a thickness at the first edge region and the second edge region equal to or smaller than 70% of a thickness of the gate insulation layer in the middle of the channel region.

In the transistor structure according to an embodiment, the substrate has a channel region located under the polysilicon layer and between the source region and the drain region.

In the transistor structure according to an embodiment, the first opening pattern includes at least a first opening, and the second opening pattern includes at least a second opening.

In the transistor structure according to an embodiment, a bottom portion of the first opening pattern and the second opening pattern is covered by a dielectric layer.

In the transistor structure according to an embodiment, the dielectric layer is a spacer on a sidewall of the first opening pattern and the second opening pattern.

In the transistor structure according to an embodiment, the first opening pattern and the second opening pattern is identical or different.

In the transistor structure according to an embodiment, at least one of the first opening pattern and the second opening pattern includes an opening located between the source region and the drain region without overlapping the source region and the drain region in a plane view.

In the transistor structure according to an embodiment, at least one of the first opening pattern and the second opening pattern disposes over and is adjacent to the source region and the drain region.

In an embodiment, the transistor structure further includes a lightly doped region in the substrate, the lightly doped region is located on two sides of the polysilicon layer correspondingly to the source region and the drain region in a plane view.

In the transistor structure according to an embodiment, two sidewalls of the polysilicon layer do not have a spacer on the lightly doped region, or two sidewalls of the polysilicon layer have a spacer on the lightly doped region.

In the transistor structure according to an embodiment, the first edge region and the second edge region equal to or are smaller than 1 nm on the second direction.

In the transistor structure according to an embodiment, each of the first opening pattern and the second opening pattern has a single opening or a plurality of openings.

In the transistor structure according to an embodiment, the first opening pattern has a first opening on a center line between the source region and the drain region, and the second opening pattern has a second opening on the center line between the source region and the drain region.

In the transistor structure according to an embodiment, the first opening includes a portion other than the first portion and extending outward from a first edge line formed by a first edge of the source region and of the drain region, and the second opening includes a portion other than the first portion and extending outward from a second edge line formed by a second edge of the source region and of the drain region.

In the transistor structure according to an embodiment, the first opening pattern includes a first opening and a second opening, the first opening disposing over and adjacent to the source region, the second opening disposing over and adjacent to the source region, and the second opening pattern includes a third opening and a fourth opening, the third opening disposing over and adjacent to the source region and the fourth opening disposing over and adjacent to the source region.

In the transistor structure according to an embodiment, each of the first opening and the second opening includes a portion other than the first portion and extending outward from a first edge line formed by a first edge of the source region and of the drain region, and each of the third opening and the fourth opening includes a portion other than the first portion and extending outward from a second edge line formed by a second edge of the source region and of the drain region.

In the transistor structure according to an embodiment, a cross-sectional structure taken along the first direction of the first edge region and/or the second edge region includes the source region and the drain region in the substrate. The gate insulation layer is disposed on the substrate and between the source region and the drain region. The polysilicon layer is disposed on the gate insulation layer and has an opening in between the source region and the drain region exposing the gate insulation layer.

In the transistor structure according to an embodiment, a cross-sectional structure taken along the second direction of the gate region includes a gate insulation layer disposed on the substrate and between the source region and the drain region. The polysilicon layer is disposed on the gate insulation layer. The polysilicon layer has a first opening at a first edge region for at least exposing a first edge of the gate insulation layer and has a second opening at a second edge region for at least exposing a second edge of the gate insulation layer.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
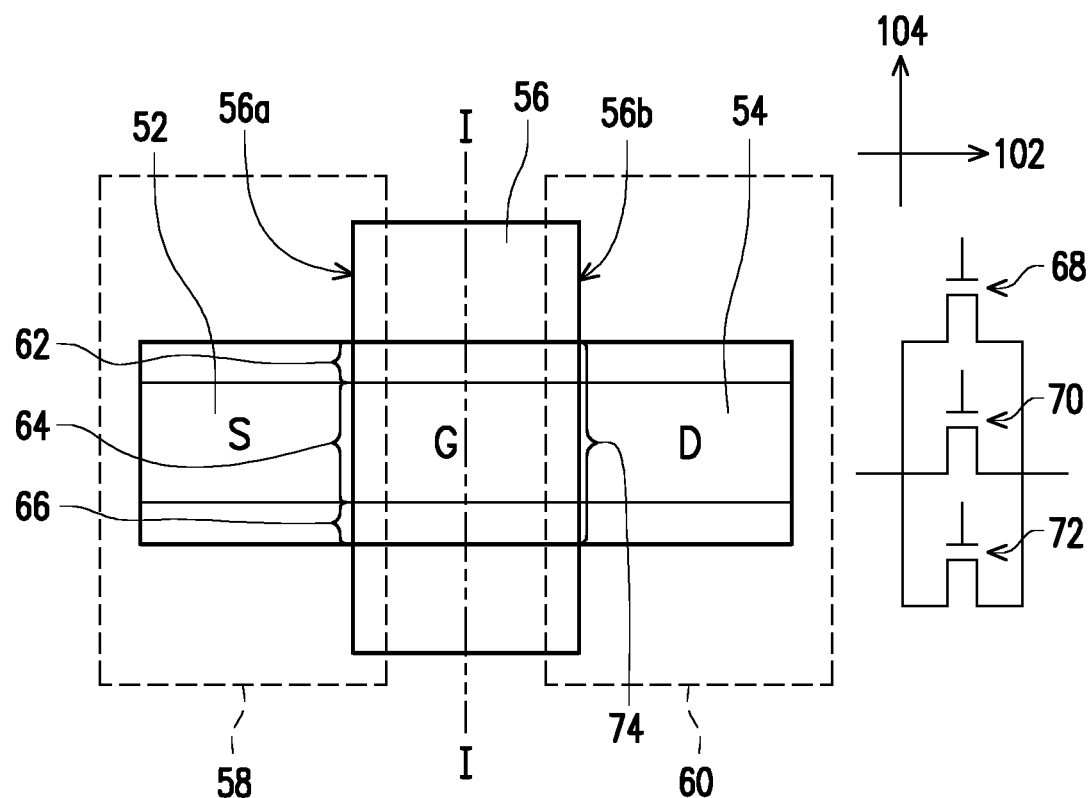
FIG. 1 is a schematic top view of a transistor structure including two edge transistors and a main channel transistor according to an embodiment of the invention.

Some other embodiments of the invention are provided as follows. It should be noted that the reference numerals and part of the contents of the previous embodiment are used in the following embodiments, in which identical reference numerals indicate identical or similar components, and repeated description of the same technical contents is omitted. Please refer to the description of the previous embodiment for the omitted contents, which will not be repeated hereinafter.

The performance of transistors may be affected by many factors, and the conditions of a gate insulation layer may also affect the operating performance of transistors. For example, generally speaking, a gate insulation layer decreases in thickness on the edge after being formed by a thermal oxidation process. As for a gate between a source region and a drain region, through more meticulous observation, a center region and two edge regions may be viewed as three sub-transistors among which the center region sub-transistor is the major one. Therefore, under general performance requirements, the edge region sub-transistors are ignorable. However, if higher performance is required, the effects of the edge region sub-transistors become significant. The effects of the edge region sub-transistors become significant when the size of component is small, for example, or when the transistor is operated at MV or HV, for example.

Figure 4:
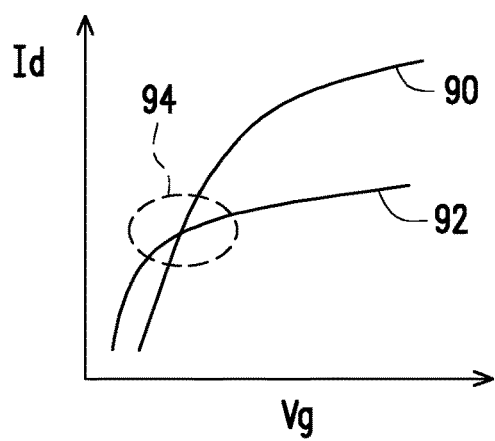
FIG. 4 is a schematic view of an I-V curve corresponding to a conduction current and a gate voltage of an edge transistor and a main channel transistor of a transistor structure according to an embodiment of the invention.
Figure 5:
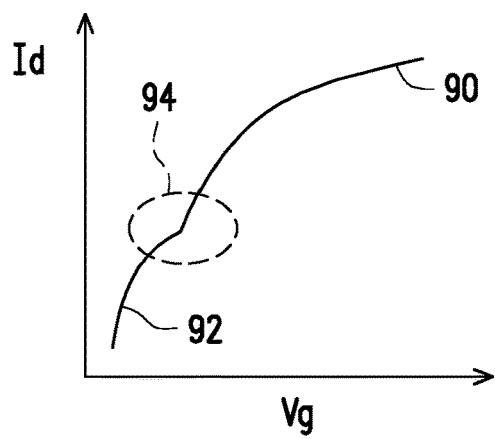
FIG. 5 is a schematic view of a kink effect of an I-V curve due to an effect of a transistor structure including an edge transistor according to an embodiment of the invention.
Figure 6:
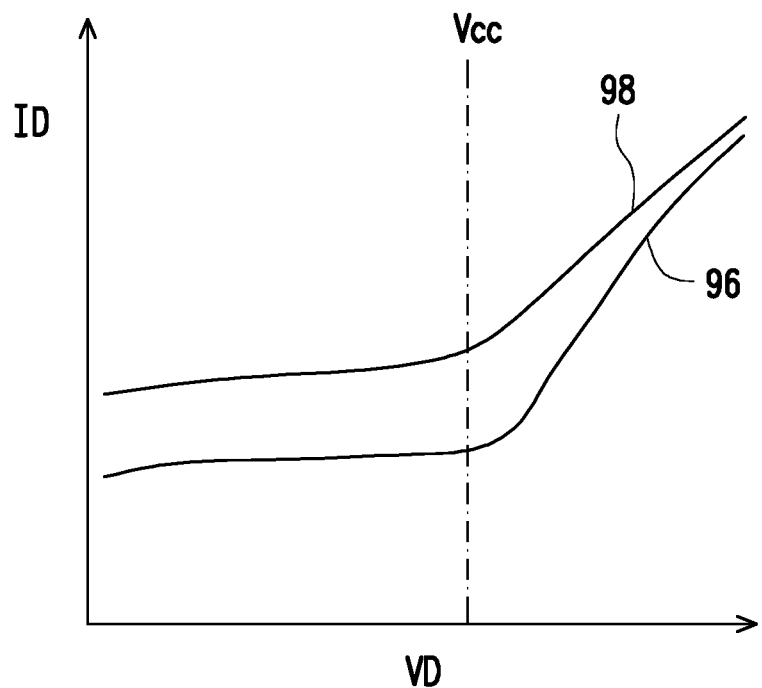
FIG. 6 is a schematic view of a GIDL mechanism due to an edge effect of a gate insulation layer of a transistor structure according to an embodiment of the invention.

The current kink effect caused by the gate insulation layer occurs because the gate insulation layer of edge region sub-transistor has a thinner thickness and a lower threshold voltage (Vt), and the starting speed is thereby faster. The gate insulation layer of center region sub-transistor has a thickness in accordance with the design and has a higher threshold voltage, and the starting speed is thereby lower. Therefore, the current kink effect is as illustrated in FIG. 4 and FIG. 5 to be provided in the following. In addition, the occurrence of GIDL is as illustrated in FIG. 6 to be provided in the following.

The following will describe some embodiments as examples of the invention; however, the invention is not limited by the embodiments.

FIG. 1 is a schematic top view of a transistor structure including two edge transistors and a main channel transistor according to an embodiment of the invention. Referring to FIG. 1, the invention looks into the structure of a transistor and qualitatively divides the transistor into two edge transistors 68 and 72 and a main channel transistor 70 based on a thickness of a gate insulation layer.

Figure 2:
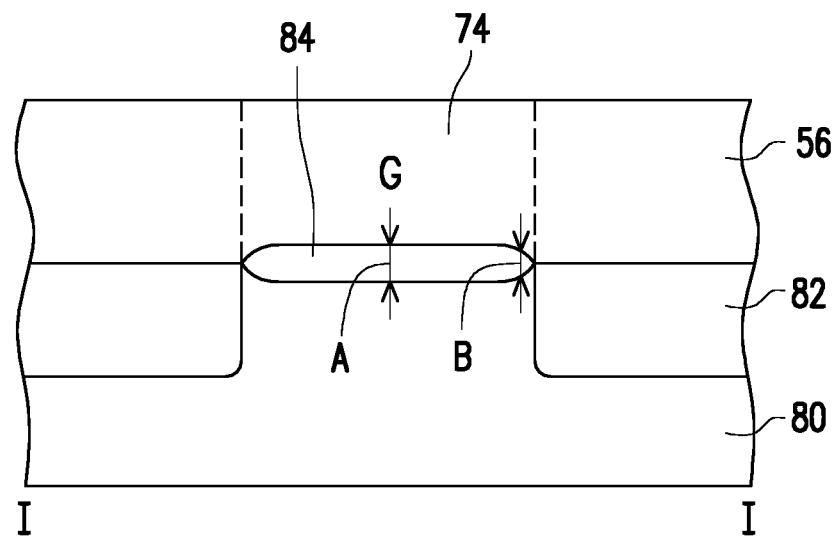
FIG. 2 is a schematic cross-sectional view of a transistor structure along a polysilicon layer according to an embodiment of the present invention.
Figure 8:
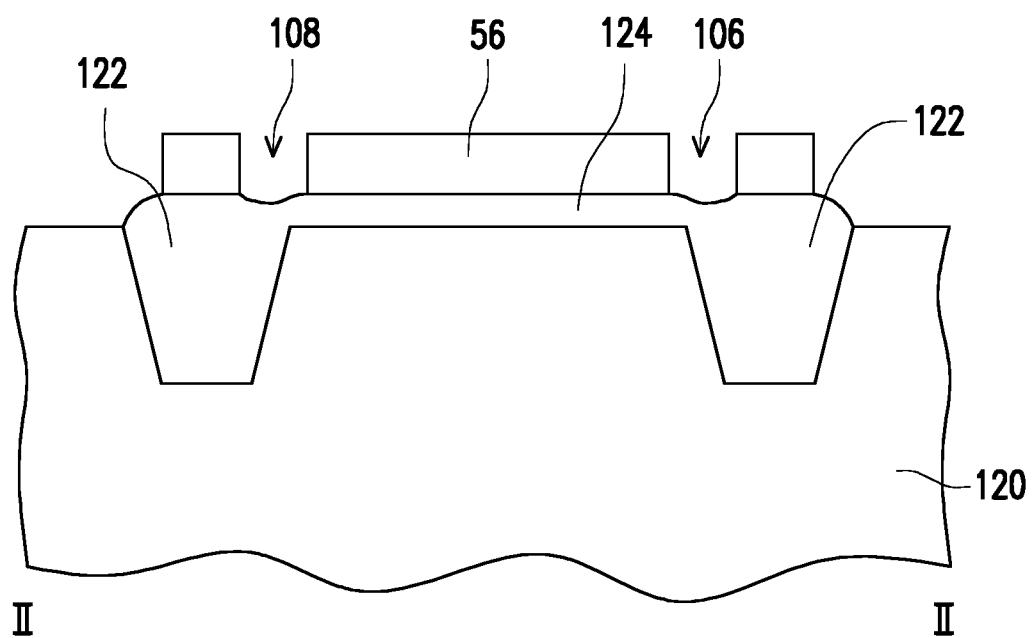
FIG. 8 is a cross-sectional view of a part of a transistor structure taken along line II-II of FIG. 7 according to an embodiment of the invention.

Taking MV transistor for example, when viewing from the top, a general transistor structure includes a source region (S) 52 and a drain region (D) 54, disposed in a substrate such as substrate 80 illustrated in FIG. 2 and substrate 120 illustrated in FIG. 8. The source region 52 and the drain region 54 extend along a first direction 102. A polysilicon layer 56 is disposed over the substrate and extends along a second direction 104 perpendicular to the first direction 102. The polysilicon layer 56 includes a first edge region 62, a channel region 64 and a second edge region 66 formed as a gate region 74 located between the source region 52 and the drain region 54. A part of the polysilicon layer 56 in the gate region 74 functions as a gate structure (G). The transistor structure may be divided into two edge transistors 68 and 72 and a main channel transistor 70 corresponding to the first edge region 62, the channel region 64 and the second edge region 66.

MV transistor is taken as an example in the embodiment herein, wherein a plurality of lightly doped regions 58 and 60 corresponding to the source region 52 and the drain region 54 are formed on the substrate in advance and overlap with the polysilicon layer 56. A spacer may not be required to form on a sidewall of the polysilicon layer 56. However, the transistor of the invention is not limited to MV transistors. Low voltage transistors or HV transistors, for example, are also applicable. Alternatively, transistors of other structures, such as fin field-effect transistors (Fin FET), are also applicable.

FIG. 2 is a schematic cross-sectional view of a transistor structure along a polysilicon layer according to an embodiment of the present invention. Referring to FIG. 2, the invention inspects the change of thickness of the gate insulation layer. For example, viewing from the cross-sectional structure taken along line I-I of FIG. 1, on the substrate 80 is a region where a gate insulation layer 84 is expected to form, which is generally determined by two insulation structures 82. A surface of the substrate 80, for example, is oxidized to form the gate insulation layer 84 by a thermal oxidation process. A thickness B within the edge region of the gate insulation layer 84, in which the edge region is adjacent to the insulation structure 82, formed by the thermal oxidation process gradually shrinks and the gate insulation layer 84 finally merges with the insulation structure 82. As most of a thickness A on the center region of the gate insulation layer 84 may be maintained at a predetermined thickness and the thickness B on the edge region shrinks, the invention qualitatively divides the transistor into two edge regions 62 and 66. For example, the thickness B equals to or is smaller than 70% of the thickness A.

Figure 3:
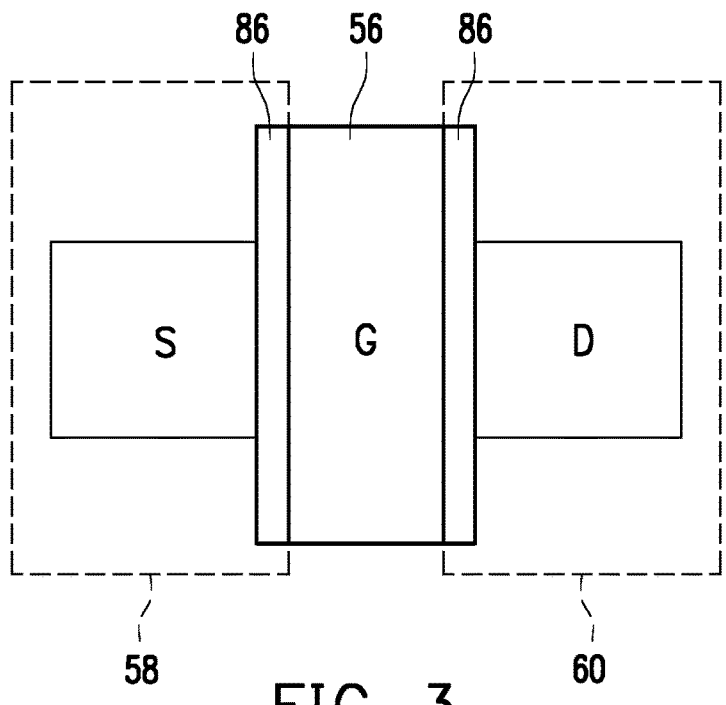
FIG. 3 is a schematic top view of a transistor structure according to an embodiment of the present invention.

FIG. 3 is a schematic top view of a transistor structure according to an embodiment of the present invention. Referring to FIG. 3, a transistor in the embodiment is, for example, a LV transistor, wherein a plurality of lightly doped regions 58 and 60 are generally formed by a polysilicon 56 providing a gate (G). Then, a spacer 86, a source region (S) and a drain region (D) are formed on a sidewall of the polysilicon layer 56. The plurality of lightly doped regions 58 and 60 and the polysilicon layer 56 are not required to substantially overlap herein.

Provided as follows is the problem investigated by the invention. FIG. 4 is a schematic view of an I-V curve corresponding to a conduction current and a gate voltage of an edge transistor and a main channel transistor of a transistor structure according to an embodiment of the invention. Referring to FIG. 4, since the gate insulation layer 84 has a relative thinner thickness at the edge regions 62 and 66 than on the center region, an I-V curve 92 of the gate insulation layer 84 relating the gate voltage Vg to the drain voltage Id is different from an I-V curve 90 of the channel region 64. The I-V curve 92 and the I-V curve 90 intersect at a region 94.

Since the gate insulation layer 84 has a thinner thickness on the edge regions 62 and 66 and also has a lower threshold voltage, the transistor starts conducting in an unexpectedly faster speed and results in the occurrence of kink effect. According to an embodiment of the invention, FIG. 5 is a schematic view of a kink effect of an I-V curve due to an effect of a transistor structure including an edge transistor. Referring to FIG. 5, in practical operations, the combination of the two I-V curves 90 and 92 of FIG. 4 results in the occurrence of kink effect at the region 94.

In addition, the thickness of the gate insulation layer 84 would cause GIDL effect as well. According to an embodiment of the invention, FIG. 6 is a schematic view of a GIDL mechanism due to an edge effect of a gate insulation layer of a transistor structure. Referring to FIG. 6, a curve 98 shows a general condition of an edge transistor effect by relating a drain voltage VD to a drain current ID. On the other hand, a curve 96 shows an improved transistor structure provided by the invention. In a current where the transistor has not started yet, the curve 98 has a relative greater leakage than the curve 96.

Figure 7:
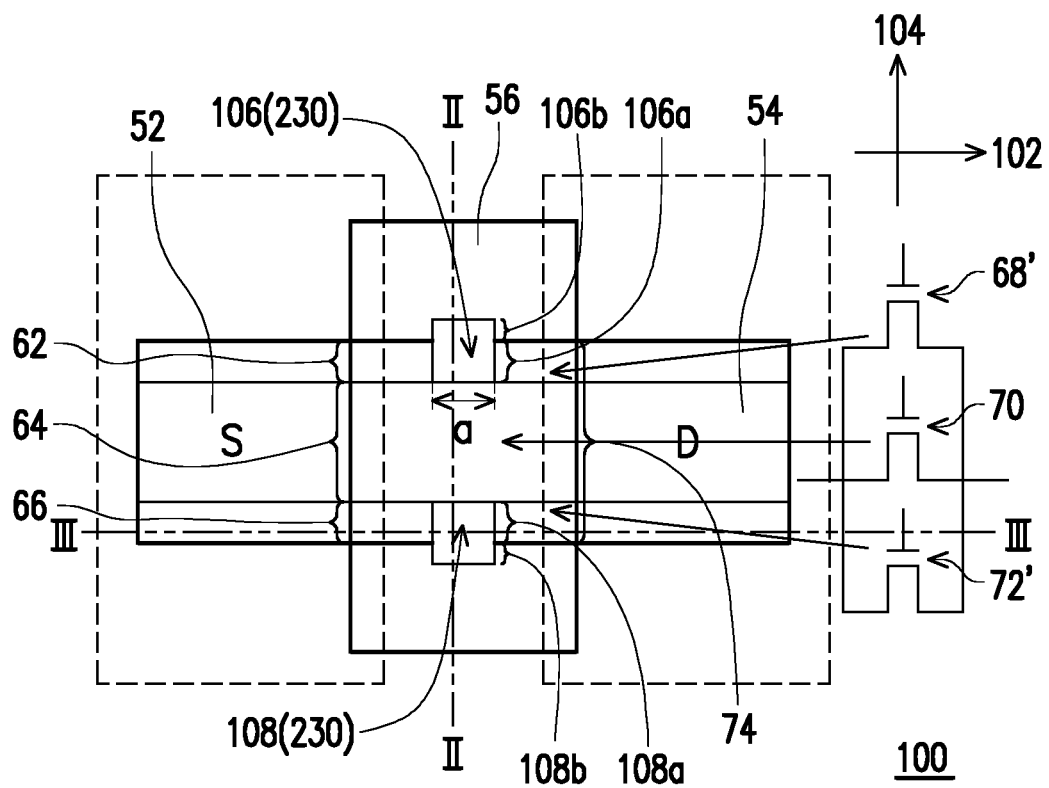
FIG. 7 is a schematic top view of a transistor structure including two edge transistors and a main channel transistor according to an embodiment of the invention.

Based on researches on the effects generated by the gate insulation layer 84 on the edge regions, the invention provides an improved transistor structure. FIG. 7 is a schematic top view of a transistor structure including two edge transistors and a main channel transistor according to an embodiment of the invention.

Referring to FIG. 7, the invention qualitatively divides the transistor into two edge transistors 68 and 72 and a main channel transistor 70 based on researches on the thickness of the gate insulation layer.

Taking MV transistor for example, when viewing from the top of a transistor structure 100, a general transistor structure includes a source region (S) 52 and a drain region (D) 54, disposed in a substrate such as substrate 80 illustrated in FIG. 2 or substrate 120 illustrated in FIG. 8. The source region 52 and the drain region 54 extend along a first direction 102. A polysilicon layer 56 is disposed over the substrate and extends along a second direction 104 perpendicular to the first direction 102. The polysilicon layer 56 includes a first edge region 62, a channel region 64 and a second edge region 66. The first edge region 62, the channel region 64 and the second edge region 66 are formed as a gate region 74 located between the source region 52 and the drain region 54. A part of the polysilicon layer 56 in the gate region 74 functions as a gate structure (G). The transistor structure may be divided into two edge transistors 68 and 72 and a main channel transistor 70 corresponding to the first edge region 62, the channel region 64 and the second edge region 66.

In this embodiment, the invention provides the polysilicon layer 56 forming an opening 106 and an opening 108 respectively at the first edge region 62 and the second edge region 64 of the gate region 74. The opening 106 and the opening 108 are single openings, for example, but generally speaking, the opening 106 and the opening 108 may be an opening pattern 230 and an opening pattern 232, wherein the location and number of openings are not limited and may be designed according to practical requirements. Embodiments of the variations will be provided in the following FIG. 10 to FIG. 13.

Regarding the disposition of the opening pattern 230 and the opening pattern 232, the opening 106 and the opening 108 are taken as examples of the opening pattern 230 and the opening pattern 232 in this embodiment. The polysilicon layer 56 includes at least a first opening pattern 230 at the first edge region 62 and at least a second opening pattern 232 at the second edge region 66. The first opening pattern 230 has a first opening portion 106a formed within the gate region 74; and the second opening pattern 232 has a second opening portion 108a formed within the gate region 74.

An opening portion 106b of the opening 106 other than the first opening portion 106a is located outside from the first edge region 62. In other words, the opening portion 106b extends outward from a first edge line formed by a first edge of the source region 52 and of the drain region 54. Similarly, the second opening 108 includes the opening portion 108b other than the second opening portion 108a extends outward from a second edge line formed by a second edge of the source region 52 and of the drain region 54. In an embodiment, a thickness of the opening 106 and the opening 108 on the first direction 102 is not specifically limited.

According to an embodiment of the invention, FIG. 8 is a cross-sectional view of a part of a transistor structure taken along line II-II of FIG. 7. Referring to FIG. 8, in the cross-section of FIG. 7, the cross-sectional structure includes a gate insulation layer 124 disposed on a substrate 120 and between the source region 52 and the drain region 54. Viewing along the second direction 104, the gate insulation layer 124 is connected to an isolation structure 122. The polysilicon layer 56 is located on the gate insulation layer 124 and the isolation structures 122. Only a part of structure related to the openings is illustrated in the polysilicon layer 56 in FIG. 8.

In addition, the polysilicon layer 56 is disposed on the gate insulation layer 124 and has a first opening 106 at the first edge region 62 for at least exposing a first edge of the gate insulation layer 124. A second opening 108 is located at the second edge region 66 for at least exposing a second edge of the gate insulation layer 124.

Figure 9:
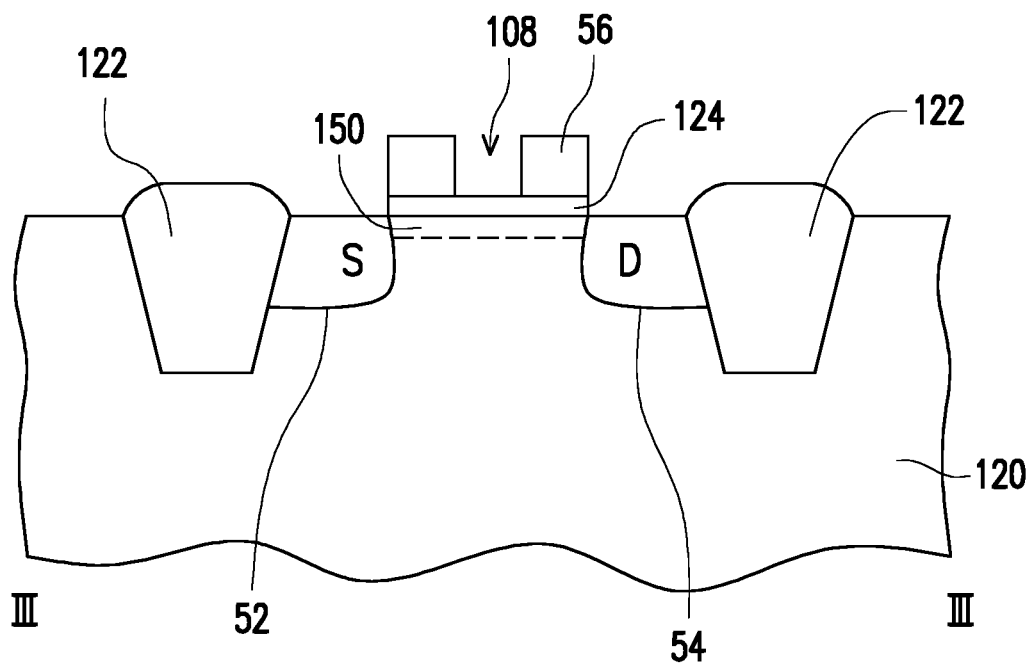
FIG. 9 is a cross-sectional view of a part of a transistor structure taken along line III-III of FIG. 7 according to an embodiment of the invention.

According to an embodiment of the invention, FIG. 9 is a cross-sectional view of a part of a transistor structure taken along line III-III of FIG. 7. Referring to FIG. 9, a cross-sectional structure taken along the first direction 102 of the first edge region 62 and/or the second edge region 66 includes, for example, a source region and a drain region in the substrate 120. The gate insulation layer 124 is disposed on the substrate 120 and between the source region 52 and the drain region 54. Moreover, the polysilicon layer 56 is disposed on the gate insulation layer 124 and has a first opening 108 in between the source region 52 and the drain region 54 for exposing the gate insulation layer 124. The substrate 120 has a channel 150 under the gate insulation layer 56 and between the source region 52 and the drain region 54. The cross-section line III-III may also be on the first edge region 62 and/or the second edge region 66 herein.

The aforementioned opening 106 and opening 108 increases a threshold voltage of edge transistors 68' and 72' and thus eliminates the occurrence of kink effects. In addition, the opening of the opening pattern 230 and the opening pattern 232 may also be adjusted with regard to the occurrence of GIDL.

Figure 10:
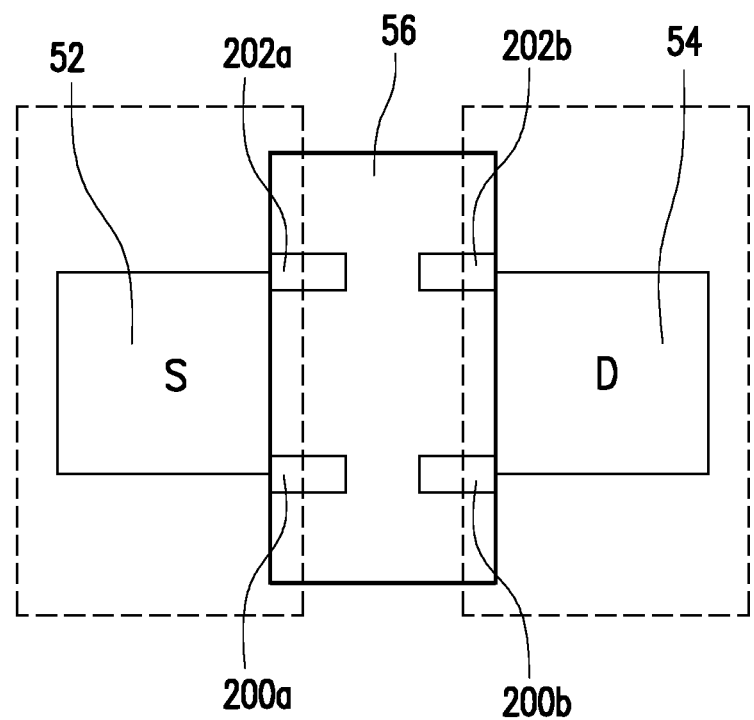
FIG. 10 is a schematic top view of a transistor structure including two opening patterns of edge transistor according to an embodiment of the invention.

According to an embodiment of the invention, FIG. 10 is a schematic top view of a transistor structure including two opening patterns of edge transistor. Referring to FIG. 10, a first opening pattern 230, for example, includes a first opening 202a disposing over and adjacent to the source region 52 and a second opening 202b disposing over and adjacent to the drain region 54. A second opening pattern 232, for example, includes a third opening 200a disposing over and adjacent to the source region 52 and a fourth opening 200b disposing over and adjacent to the drain region 54.

Similar to FIG. 7, each of the first opening 202a and the second opening 202b of FIG. 10 extends outward from a first edge line formed by a first edge of the source region 52 and of the drain region 54, which is similar to the opening portion 106b of the opening 106 of FIG. 7 other than the first opening portion 106a. Each of the third opening 200a and the fourth opening 200b extends outward from a second edge line formed by a second edge of the source region 52 and of the drain region 54, similar to the opening portion 108b of the opening 108 of FIG. 7 other than the first opening portion 108a.

The opening 200a, opening 200b, opening 202a and opening 202b in FIG. 10 not only eliminate the occurrence of kink effect but also reduce GIDL phenomenon. However, the invention is not limited to particular implementation of opening patterns.

Figure 11:
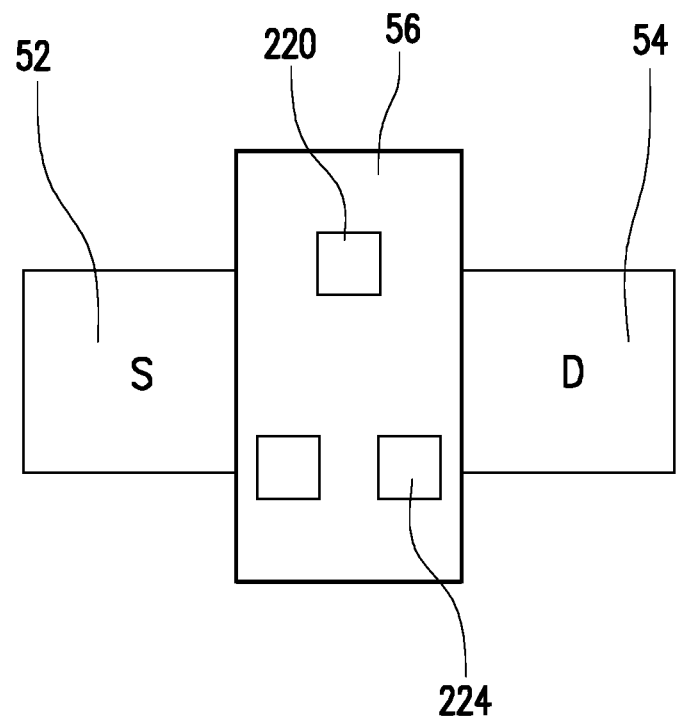
FIG. 11 is a schematic top view of a transistor structure including two opening patterns of edge transistor according to an embodiment of the invention.

According to an embodiment of the invention, FIG. 11 is a schematic top view of a transistor structure including two opening patterns of edge transistor. Referring to FIG. 11, in an embodiment, a number of an opening 220 at an edge region is one, as a number of an opening 224 at another edge region is more than one, such as two.

Figure 12:
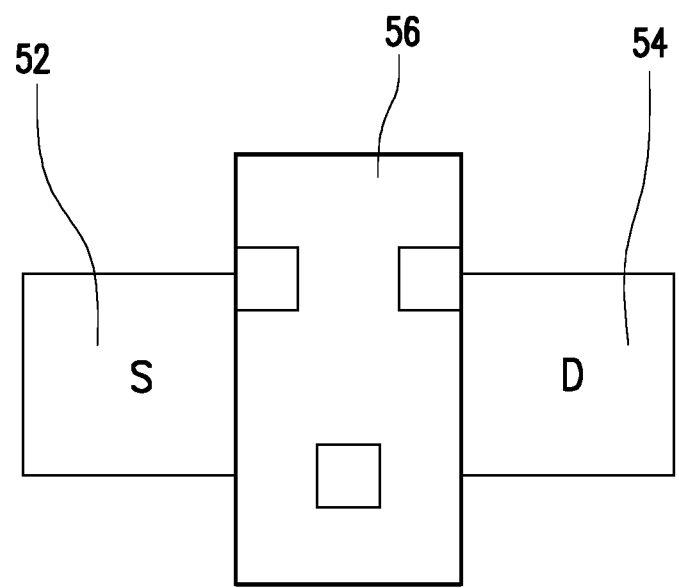
FIG. 12 is a schematic top view of a transistor structure including two opening patterns of edge transistor according to an embodiment of the invention.

According to an embodiment of the invention, FIG. 12 is a schematic top view of a transistor structure including two opening patterns of edge transistor. Referring to FIG. 2, in an embodiment, an opening at an edge region may adapt the opening 202a and opening 202b of FIG. 10, as an opening at another edge region may adapt the opening 108 of FIG. 7.

Figure 13:
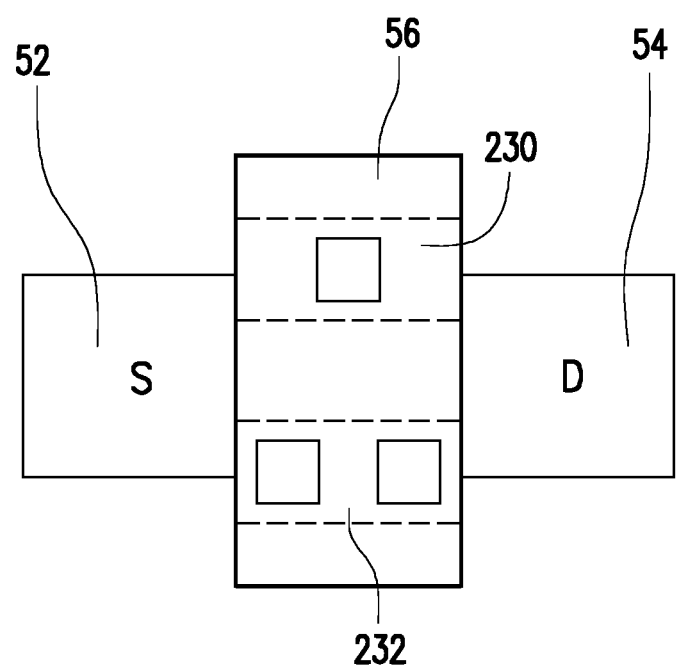
FIG. 13 is a schematic top view of a transistor structure including two opening patterns of edge transistor according to an embodiment of the invention.

According to an embodiment of the invention, FIG. 13 is a schematic top view of a transistor structure including two opening patterns of edge transistor. Referring to FIG. 13, generally speaking, a number and location of the opening 230 and the opening 232 may be modified properly, and the opening 230 and the opening 232 may be of identical or different pattern.

Figure 14:
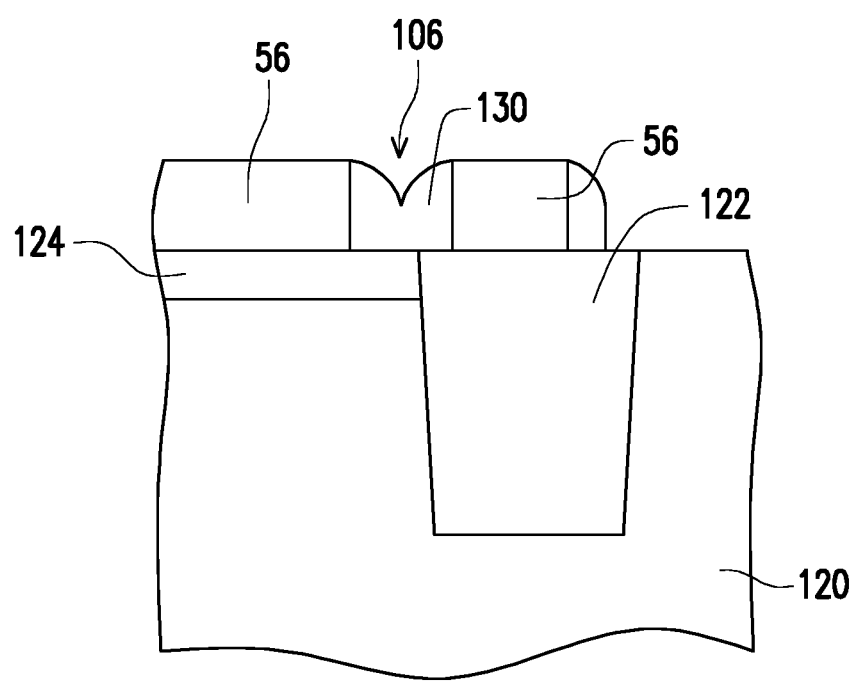
FIG. 14 is a schematic cross-sectional view of an opening of an edge transistor according to an embodiment of the present invention.

FIG. 14 is a schematic cross-sectional view of an opening of an edge transistor according to an embodiment of the present invention. Referring to FIG. 14, taking the opening 106 of FIG. 8 as an example, a bottom portion of an opening of a transistor structure is covered by a dielectric layer 130. In other words, a bottom portion of an opening pattern is covered by the dielectric layer 130. The dielectric layer 130 is, for example, a spacer left on the sidewall by other manufacturing process and may not require to be applied by an additional process.

Regarding the transistor structure, the invention provides a polysilicon layer including at least a first opening pattern at the first edge region and at least a second opening pattern at the second edge region. The first opening pattern has a first portion overlapping the gate region, and the second opening pattern has a second portion overlapping the gate region. The opening increases the threshold voltage of the sub-transistor at the edge region and at least eliminates the occurrence of kink effect or that of GIDL.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A transistor structure, comprising:
   a source region and a drain region disposed in a substrate and extend extending along a first direction; and
   a polysilicon layer, disposed over the substrate and extending along a second direction perpendicular to the first direction, wherein the polysilicon layer comprises a first edge region, a second edge region, and a channel region between the first edge region and the second edge region, the first edge region, the channel region and the second edge region formed as a gate region between the source region and the drain region in a plane view,
   wherein the polysilicon layer comprises a first opening pattern at least partially disposed in the first edge region and a second opening pattern at least partially disposed in the second edge region, the first opening pattern has a first portion located in the gate region, and the second opening pattern has a second portion located in the gate region,
   wherein the first opening pattern comprises at least one opening, disposing over and between the source region and the drain region,
   wherein the second opening pattern comprises at least one opening, disposing over and between the source region and the drain region,
   wherein the first opening pattern and the second opening pattern are not distributed into the channel region,
   wherein the first opening pattern is different from the second opening pattern in opening distribution,
   wherein the at least one opening of the first opening pattern or the second opening pattern comprises a first opening and a second opening, the first opening disposed over and adjacent to the source region, the second opening disposed over and adjacent to the drain region,
   wherein the at least one opening of a remaining opening pattern comprises a third opening disposed over and between the drain region and the source region.

2. The transistor structure according to claim 1,
   wherein each of the first opening and the second opening includes a portion other than the first portion, extending over and outward from a first edge line formed by a first edge of the source region and a first edge of the drain region,
   wherein the third opening includes a portion other than the second portion, extending over and outward from a second edge line formed by a second edge of the source region and a second edge of the drain region.

3. The transistor structure according to claim 1,
   wherein the at least one opening of the first opening pattern includes a portion other than the first portion, extending over and outward from a first edge line formed by a first edge of the source region and a first edge of the drain region,
   wherein the at least one opening of the second opening pattern includes a portion other than the second portion, extending over and outward from a second edge line formed by a second edge of the source region and a second edge of the drain region.

4. The transistor structure according to claim 1, wherein the at least one opening of the first opening pattern is one opening and the at least one opening of the second opening pattern is two openings.

5. The transistor structure according to claim 1, further comprises a spacer on a sidewall the polysilicon layer.

6. The transistor structure according to claim 1, further comprising a gate insulating layer between the polysilicon layer and the substrate,
   wherein the gate insulating layer extends to a region under the at least one opening of the first opening pattern and/or the at least one opening of the second opening pattern,
   wherein a dielectric part covers a bottom portion of the at least one opening of the first opening pattern and/or the at least one opening of the second opening pattern.

7. The transistor structure according to claim 1, wherein the at least one opening of the first opening pattern are two openings and the at least one opening of the second opening pattern is one opening.

* * * * *